United States Patent

Wu

Patent Number: 5,933,742
Date of Patent: Aug. 3, 1999

[54] MULTI-CROWN CAPACITOR FOR HIGH DENSITY DRAMS

[75] Inventor: Shye-Lin Wu, Hsinchu, Taiwan

[73] Assignee: Powerchip Semiconductor Corp., Hsinchu, Taiwan

[21] Appl. No.: 08/708,236

[22] Filed: Sep. 6, 1996

[51] Int. Cl.⁶ ................................................. H01L 21/20
[52] U.S. Cl. ..................... 438/398; 438/397; 438/253; 438/255
[58] Field of Search .................. 438/398, 397, 438/396, 253, 255

[56] References Cited

U.S. PATENT DOCUMENTS

| | | | |
|---|---|---|---|
| 5,158,905 | 10/1992 | Ahn | 438/396 |
| 5,256,587 | 10/1993 | Jun et al. | 438/253 |
| 5,266,512 | 11/1993 | Kirsch | 438/253 |
| 5,342,800 | 8/1994 | Jun | 438/396 |
| 5,358,888 | 10/1994 | Ahn et al. | 438/396 |
| 5,427,974 | 6/1995 | Lur et al. | 438/396 |
| 5,491,103 | 2/1996 | Ahn et al. | 438/396 |
| 5,650,351 | 7/1997 | Wu | 438/398 |
| 5,700,709 | 12/1997 | Park et al. | 438/397 |
| 5,702,968 | 12/1997 | Chen | 438/253 |

*Primary Examiner*—Charles Bowers
*Assistant Examiner*—Craig Thompson
*Attorney, Agent, or Firm*—Ladas & Parry

[57] ABSTRACT

A method of manufacturing multi-crown shape capacitors for use in semiconductor memories. The present invention uses the high etching selectivity between TEOS-oxide and polysilicon to fabricate the capacitor. using HSG-Si as an etching mask to etch the second dielectric layer to form dielectric pillars. An etching process is performed using the dielectric pillars as a mask to etching a portion of the first conductive layer and to etch away the remaining HSG-Si. Then side wall spacer are formed on the side walls of the dielectric pillars. Next, a selective etching process is used to define a multi-crown shape structure. Utilizing the pillars as a mold, the present invention can be used to form the multi-crown shaped structure to increase the surface area of the capacitor.

14 Claims, 6 Drawing Sheets

5,933,742

MULTI-CROWN CAPACITOR FOR HIGH DENSITY DRAMS

FIELD OF THE INVENTION

The present invention relates to semiconductor capacitors, and more specifically, to a method of making a high capacitance memory cell capacitor.

BACKGROUND OF THE INVENTION

Semiconductor Dynamic Random Access Memory (DRAM) devices have many memory cells. Indeed, a memory cell is provided for each bit stored by a DRAM device. Each memory cell typically consists of a storage capacitor and an access transistor. Either the source or drain of the access transistor is connected to one terminal of the capacitor. The other side of the transistor and the transistor gate electrode are connected to external connection lines called a bit line and a word line, respectively. The other terminal of the capacitor is connected to a reference voltage. The formation of a DRAM memory cell comprises the formation of a transistor, a capacitor and contacts to external circuits. The capacitor type that has been typically used in DRAM memory cells are planar capacitors, because they are relatively simple to manufacture.

In order to achieve high performance (i.e. high density) DRAM devices, the memory cells must be scaled down in size to the submicrometer range. As the capacity of DRAMs has increased, the size of the memory cells have steadily decreased. If planar capacitors are used, as the memory cells decrease in size, the area of the capacitors also decrease, resulting in a reduction of cell capacitance. For very small memory cells, planar capacitors become very difficult to use reliably. Specifically, as the size of the capacitor decreases, the capacitance of the capacitor also decreases and the amount of the charge capable of being stored by the capacitor similarly decreases. This results in the capacitor being very susceptible to a particle interference. Additionally, as the capacitance decreases, the charge held by storage capacitor must be refreshed often. A simple stacked capacitor can not provide sufficient capacitance, even with high dielectric $Ta_2O_5$.

Prior art approaches to overcoming these problems have resulted in the development of the trench capacitor (see for example U.S. Pat. No. 5,374,580) and the stacked capacitor. The trench capacitor has the well known problem of "gated diode leakage," which is the leakage of current resulting in the trench capacitor failing to hold a charge. Reducing the thickness of the dielectric also can improve the capacitance of the capacitor, but this approach is limited because of yield and reliability problems.

A new capacitor-over-bit-line (COB) cell with a hemispherical-grain (HSG-Si) polysilicon storage node has been developed (see CAPACITOR-OVER-BIT-LINE CELL WITH HEMISPHERICAL-GRAIN STORAGE NODE FOR 64 Mb DRAMs", M. Sakao et al., microelectronics research laboratories, NEC Corporation). The HSG-Si is deposited by low pressure chemical vapor deposition method at the transition temperature from amorphous-Si to polycrystalline-Si. This memory cell provides large storage capacitance by increasing the effective surface area of a simple storage node and is manufactured by optical delineation. The HSG-Si storage node can be fabricated by addition of two process steps, i.e. HSG-Si deposition and a etchback. A HSG-Si electrode node has been proposed (see NEW CYLINDRICAL CAPACITOR USING HEMISPHERICAL-GRAIN Si FOR 256 Mb DRAMs", H. Watanabe et al., microelectronics research laboratories, NEC Corporation). After the electrode structure is formed, a native-oxide on the electrode surface is removed by a diluted HF solution. HSG-Si appeared on silicon surface using eeding method".

SUMMARY OF THE INVENTION

The present invention thus provides capacitors with an enlarged surface area. The present invention uses the high etching selectivity between BPSG and polysilicon to fabricate the capacitor. Other oxides such as TEOS-oxide, $SiN_x$ also exhibit the high etching selectivity to silicon. Moreover, the multi-crown shape structure increases the surface area of the capacitor.

A method for manufacturing a multi-crown shaped capacitor is disclosed. The method comprises the steps of forming a first dielectric layer on the substrate. A contact hole is generated in the first dielectric layer by patterning and etching. The first conductive layer is formed over the contact hole and on the first dielectric layer preferably using conventional Low Pressure Chemical Vapor Deposition (LPCVD). The thickness of the first conductive layer is optimally 500–6000 angstroms. The first conductive layer 22 may be doped polysilicon by ion implantation or in-situ doped polysilicon. A second dielectric layer is formed, on the first conductive layer, with a thickness about 1000–10000 angstroms. The second dielectric layer preferably comprises BPSG layer, a TEOS-oxide layer or a $SiN_x$ layer. Subsequently, a hemispherical grain silicon (HSG-Si) layer is formed on the second dielectric layer with a thickness about 500–1000 angstroms. An etchant is used to etch the HSG-Si layer to separate the HSG-Si islands. The etchant of the etch to separate the HSG-Si is chosen from the group of: $SF_6+O_2$, $CF_4+O_2$, $NF_3$, $ClF_3$, $F_2$, $Cl_2$, HBr.

Next, the HSG-Si is used as an etching mask to etch the second dielectric layer to define dielectric pillars from the second layer. An etching process is performed, using the dielectric pillars as a mask, to etch a portion of the first conductive layer. At the same time the remaining HSG-Si is completely removed. Next a second conductive layer is deposited, using a conventional LPCVD process, on the dielectric pillars and contacting the first conductive layer. Then a selective etching step is applied to define multi-crown shaped structure from the second conductive layer. The next step is the deposition of a dielectric film on the surface of multi-crown shaped structure. Finally, a third conductive layer is deposited over the dielectric film. Thus, a semiconductor capacitor is formed by the multi-crown shaped structure, the dielectric film and the third conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the multi-crown shape capacitor described herein includes many process steps that are well known in the art. For example, the processes of photolithography masking and etching are well known in the art and are used extensively herein without a delated discussion of this well known technology.

In addition, the present invention uses HemiSpherical Grains Silicon (HSG-Si) as an etching mask to form a multi-pillared structure. As will be seen below, this technique can be used to form a multi-crown shaped capacitor. Further more, the high etching selectivity between oxide and polysilicon (the relative susceptibility is about 100 to 1) is used to form the multi-crown shape.

Figure 1:
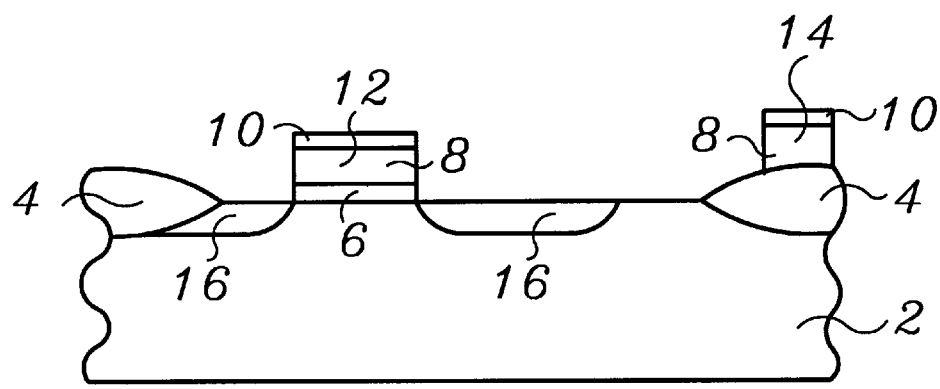
FIG. 1 is a cross section view of a semiconductor wafer illustrating the step of forming a gate structure on a semiconductor substrate.

Referring to FIG. 1, a single crystal silicon substrate 2 with a <100> crystallographic orientation, is provided. A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 4000–6000 angstroms.

Prior to forming the FOX region 4, a silicon dioxide layer 6 is created on the top surface of the substrate 2 to serve as the gate oxide for subsequently formed Metal Oxide Silicon Field Effect Transistors (MOSFETs). In one embodiment, the silicon dioxide layer 6 is formed by using an oxygen-steam ambient, at a temperature of about 850–1000° C. Alternatively, the oxide layer 6 may be formed using any suitable oxide chemical compositions and procedures. In this embodiment, the thickness of the silicon dioxide layer 6 is approximately 100 angstroms.

A doped first polysilicon layer 8 is then formed over the FOX region 4 and the silicon dioxide layer 6 using a Low Pressure Chemical Vapor Deposition (LPCVD) process. In this embodiment, the first polysilicon layer 8 has a thickness of about 500–2000 angstroms. A tungsten silicide layer 10 is formed on the first polysilicon layer 8. Next, standard photolithography and etching steps are used to form a gate structure 12 and a local interconnection 14. Subsequently, active regions 16 (i.e. the source and the drain) are formed by using well known processes to implant appropriate impurities in those regions.

Figure 2:
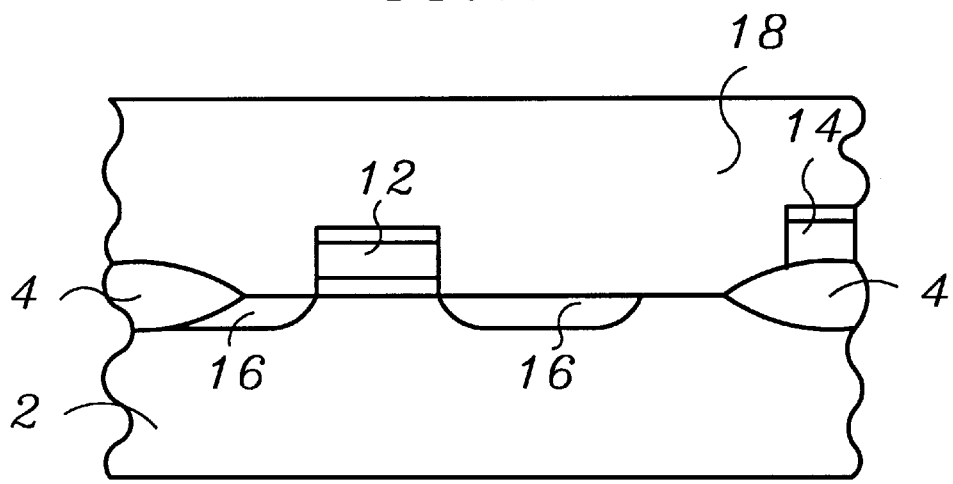
FIG. 2 is a cross section view of a semiconductor wafer illustrating the step of forming a first dielectric on the semiconductor substrate.

Turning next to FIG. 2, a first dielectric layer 18 is formed on the gate structure 12, the local interconnection 14 and the substrate 2. The first dielectric layer 18 can be formed by using suitable material such as borophosphosilicate glass (BPSG) or TEOS-oxide.

Figure 3:
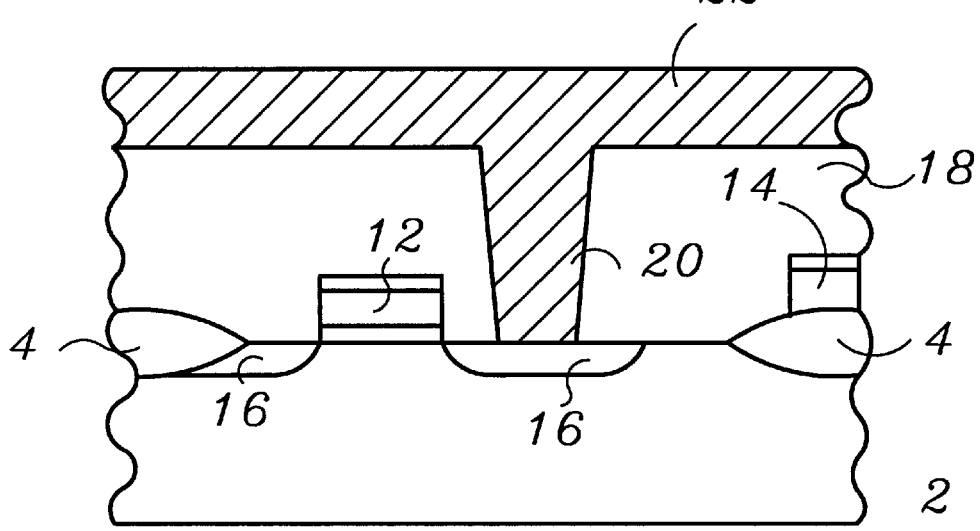
FIG. 3 is a cross section view of a semiconductor wafer illustrating the step of forming a first conductive layer.

As shown in FIG. 3, a contact hole 20 is formed in the first dielectric layer 18 by patterning and etching it. A first conductive layer 22 is formed over and in the contact hole 20 and on the first dielectric layer 18. The first conductive layer 22 is preferably formed using conventional LPCVD processing. The thickness of the first conductive layer 22, as measured over the dielectric layer 18, is optimally 1000–5000 angstroms. The first conductive layer 22 is preferably chosen from doped polysilicon or in-situ doped polysilicon. Alternatively, a metal layer, such as aluminum, copper, tungsten, titanium can also be used as the first conductive layer 22.

Figure 4:
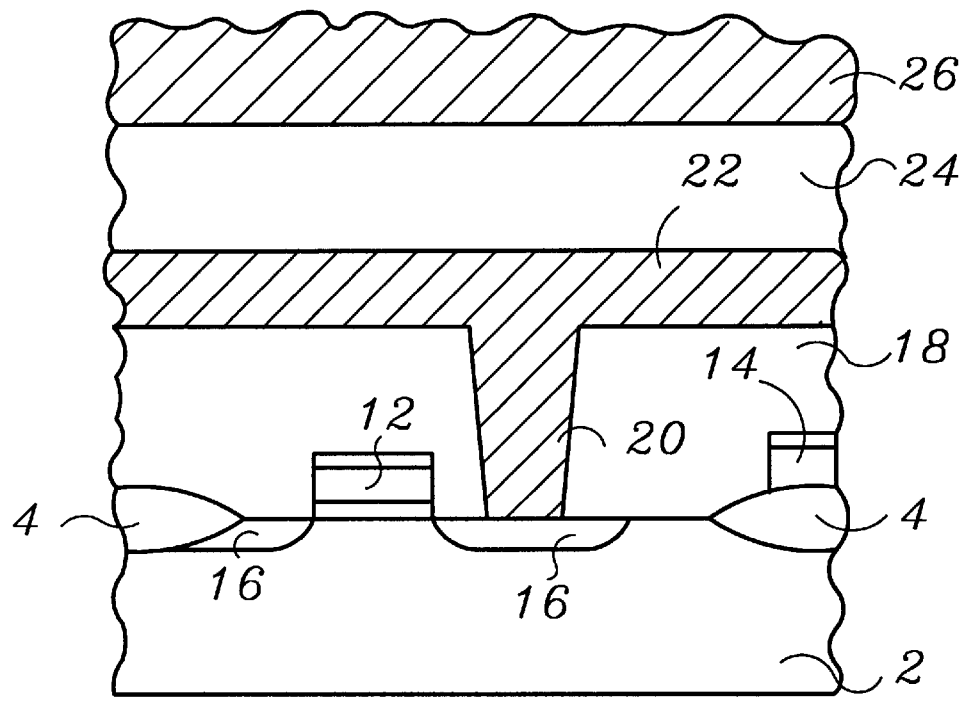
FIG. 4 is a cross section view of a semiconductor wafer illustrating the step of forming the second dielectric layer on the first conductive layer and forming a HSG-Si layer on the second dielectric layer.

Turning now to FIG. 4, a second dielectric layer 24 is formed on the first conductive layer 22 with a thickness about 500–6000 angstroms. The second dielectric layer 24 preferably comprises BPSG. A TEOS-oxide layer or $SiN_x$ can be utilized in lieu of the BPSG as the second dielectric layer 24, if desired. Subsequently, a HSG-Si layer 26 is formed on the second dielectric layer 24 with a thickness about 500–1000 angstroms.

Figure 5:
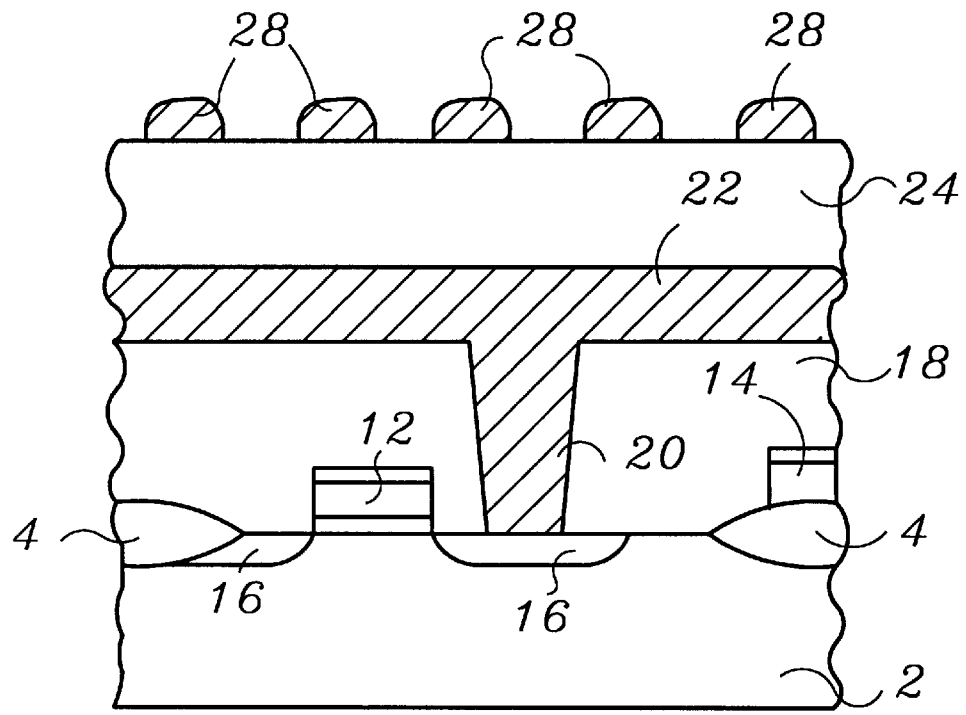
FIG. 5 is a cross section view of a semiconductor wafer illustrating the step of etching the HSG-Si layer to form smaller HSG-Si.

Turning next to FIG. 5, an etching is used to etch the HSG-Si layer 26. The grains forming HSG-Si layer 26 are separated by this etch to define HemiSpherical Grains (HSG-Si) 28 on the surface of the second dielectric layer 24. The etchant of the etch to separate the HSG-Si is chosen from the group of: $SF_6+O_2$, $CF_4+O_2$, $NF_3$, $ClF_3$, $F_2$, $Cl_2$, HBr.

Figure 6:
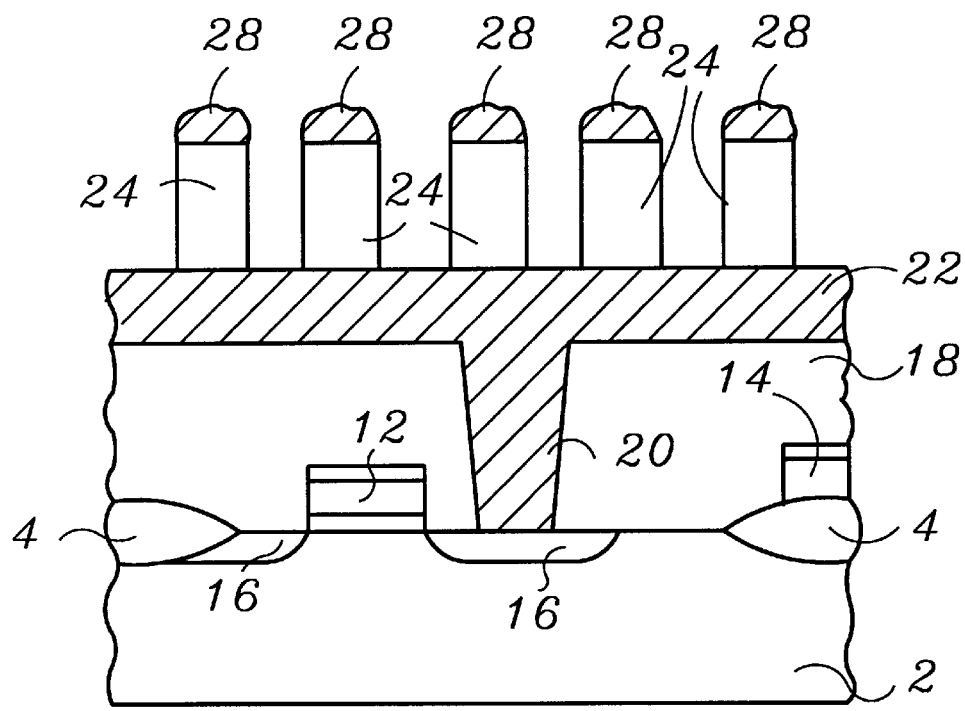
FIG. 6 is a cross section view of a semiconductor wafer illustrating the step of etching the second dielectric layer to form dielectric pillars.

Next, as seen in FIG. 6, the HSG-Si 28 are used as an etching mask to etch the second dielectric layer 24 to form dielectric pillars 24. The etchant used to define the pillars 24 is preferably chosen from $CF_4/CHF_3/Ar$, $CHF_3/O_2$ or $CF_4/H_2$.

Figure 7:
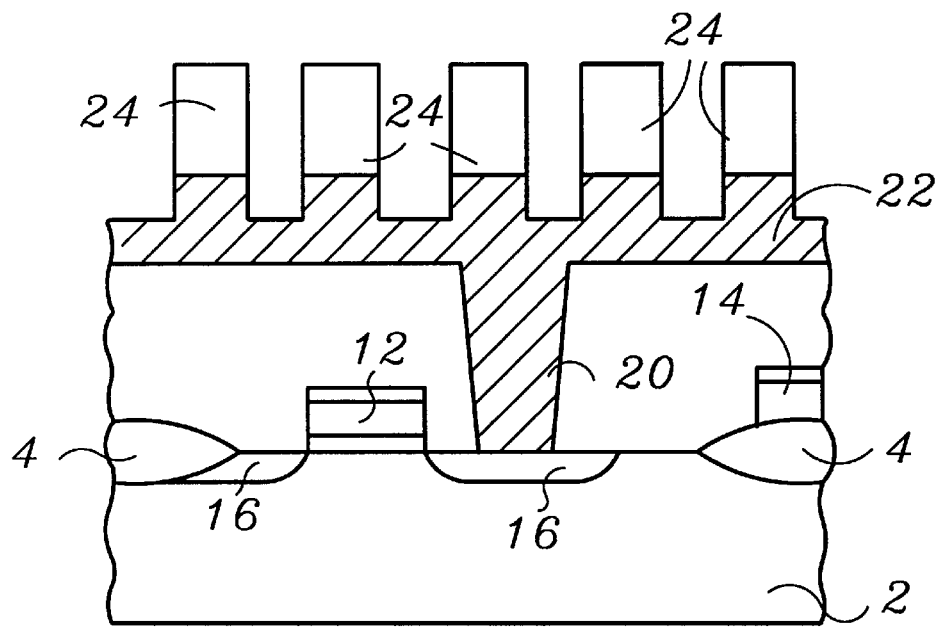
FIG. 7 is a cross section view of a semiconductor wafer illustrating the step of removing the HSG-Si and a portion of the first conductive layers.
Figure 8:
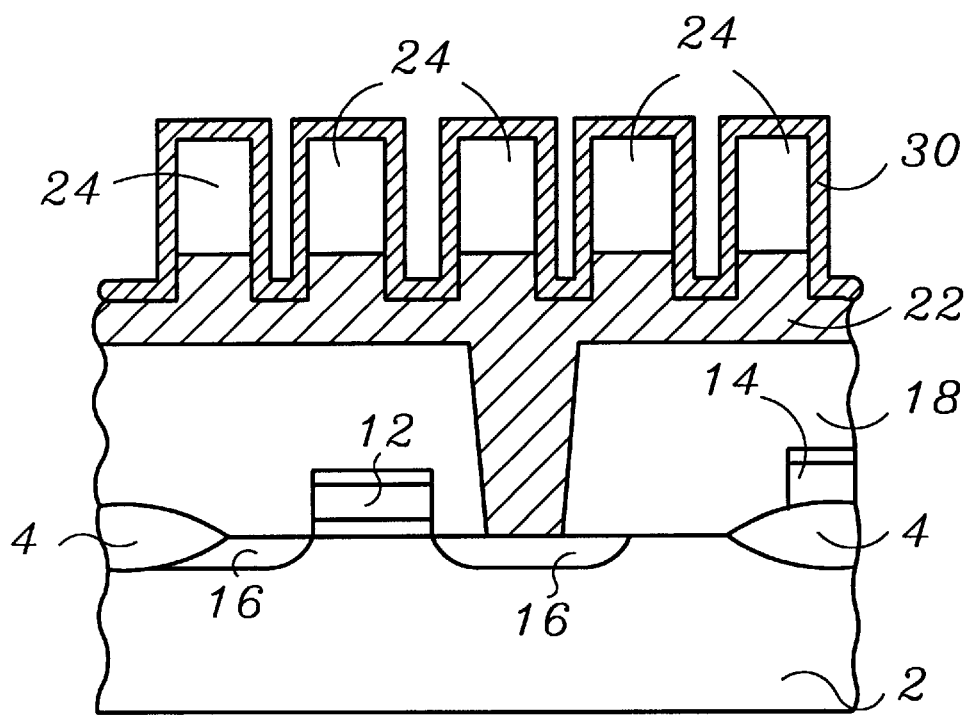
FIG. 8 is a cross section view of a semiconductor wafer illustrating the step of forming a second conductive layer along the surface of the dielectric pillars and on the surface of the first conductive layer.
Figure 9:
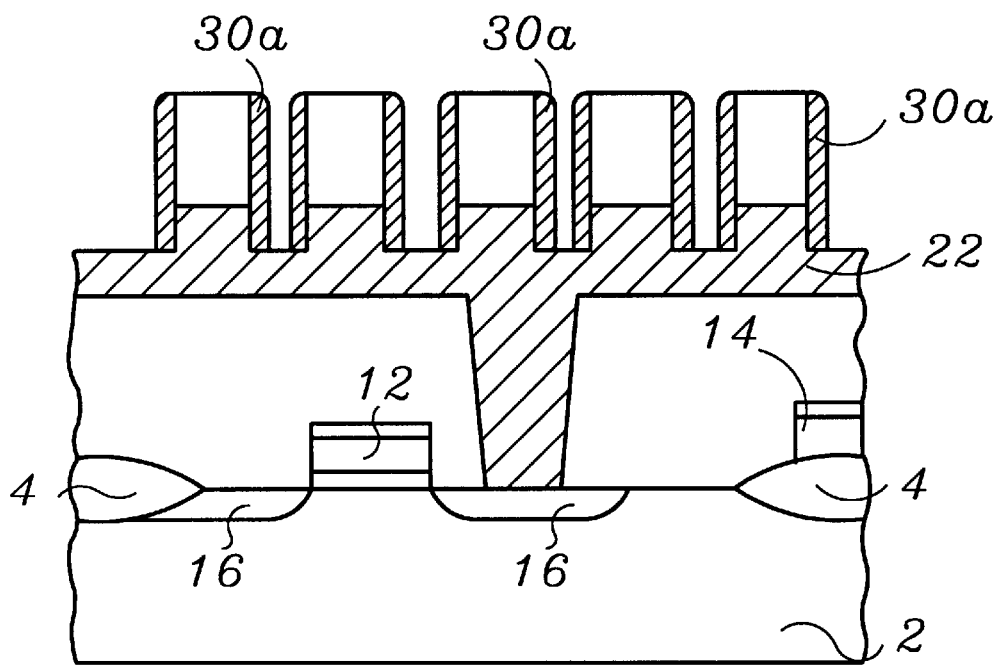
FIG. 9 is a cross section view of a semiconductor wafer illustrating the step of etching the second conductive layer to form side wall spacers.

As shown in FIG. 7, an etching process is performed by using the dielectric pillars 24 as a mask white etching a portion of the first conductive layer 22. The dielectric pillars are also used as an etch stop layer for removing the HSG-Si. Of course, the HSG-Si 28 is totally removed during this etching process. Any suitable etchant can be used for this etching, such as $C_2F_6$, $SF_6$, $CF_4+O_2$, $CF_4+Cl_2$ or $CF_4$ +HBr. Referring to FIG. 8, a second conductive layer 30 is deposited, preferably using a conventional LPCVD process, on the first conductive layer 22, the second dielectric layer 24 preferably having a thickness between 100 to 1000 angstroms. The second conductive layer 30 is preferably doped polysilicon or in-situ doped polysilicon. Conductive side wall spacers 30a are defined from layer 30 by applying an anisotropic etch to the second conductive layer 30, as shown in FIG. 9.

Figure 10:
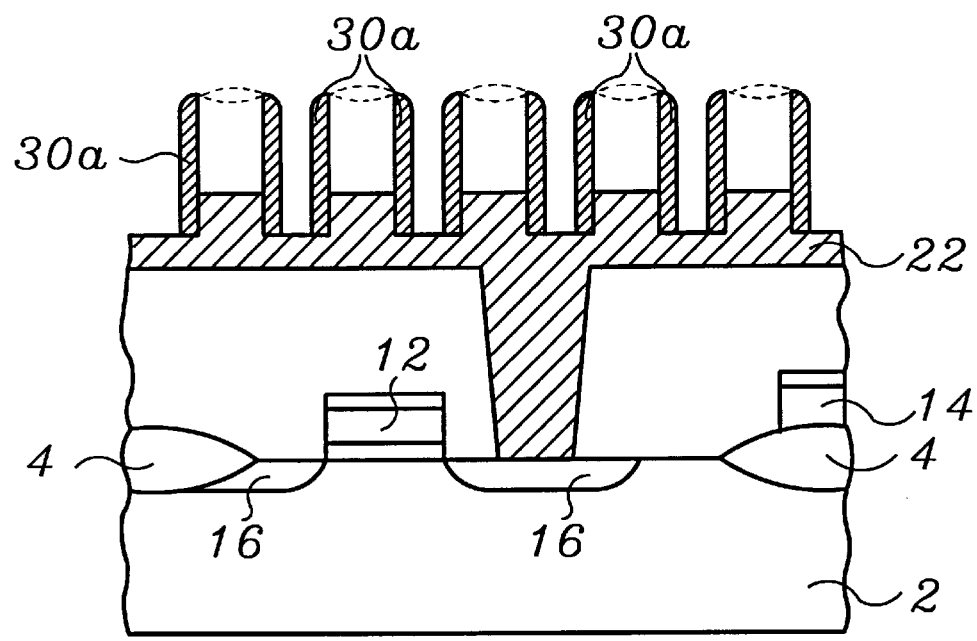
FIG. 10 is a cross section view of a semiconductor wafer illustrating the step of removing the second dielectric layer.

As shown in FIG. 10, a selective etching step is utilized to remove the dielectric pillars 24. One feature of the present invention is that the susceptibility of BPSG to etching is much greater than that of polysilicon. This selective etching step utilizes low pressure HF vapor to selectively etch the BPSG layer 24 and polysilicon side wall 30. The relative susceptibility to etching of the BPSG layer 24 to the polysilicon layers can be larger than 100 to 1. This results in the BPSG layer 24 being etched away. Other oxides such as TEOS-oxide, $SiN_x$, also exhibit the high etching selectivity to silicon. A multi-crown shaped structure is defined which consists of the first conductive layer 22 and the conductive side wall spacers 30a. The multi-crown shaped structure 22, 30a will comprise a bottom electrode of the capacitor which is being formed.

Figure 11:
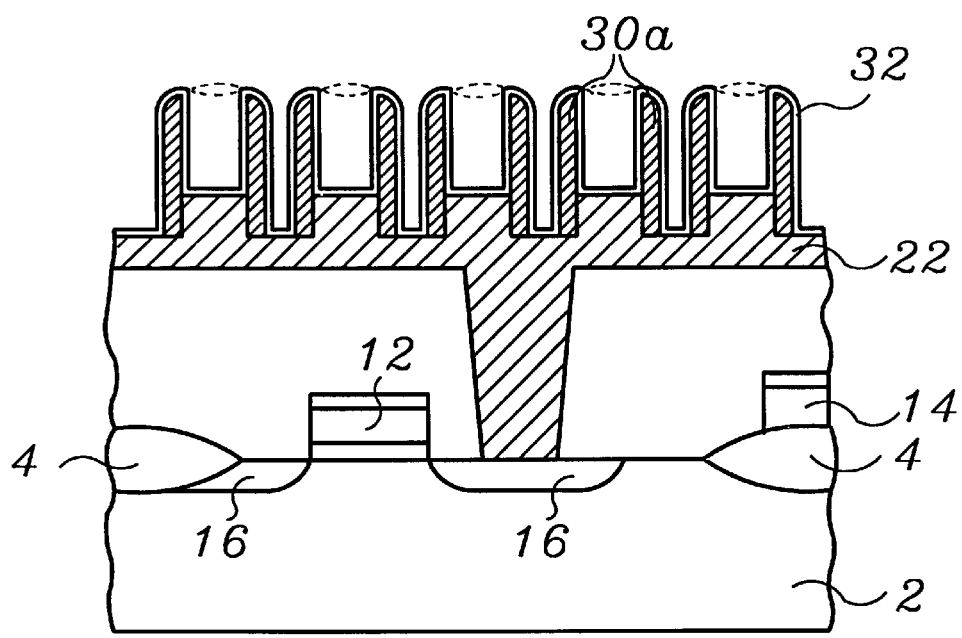
FIG. 11 is a cross section view of a semiconductor wafer illustrating the step of forming a dielectric film on the first conductive layer and on the surface of the side wall spacers.
Figure 12:
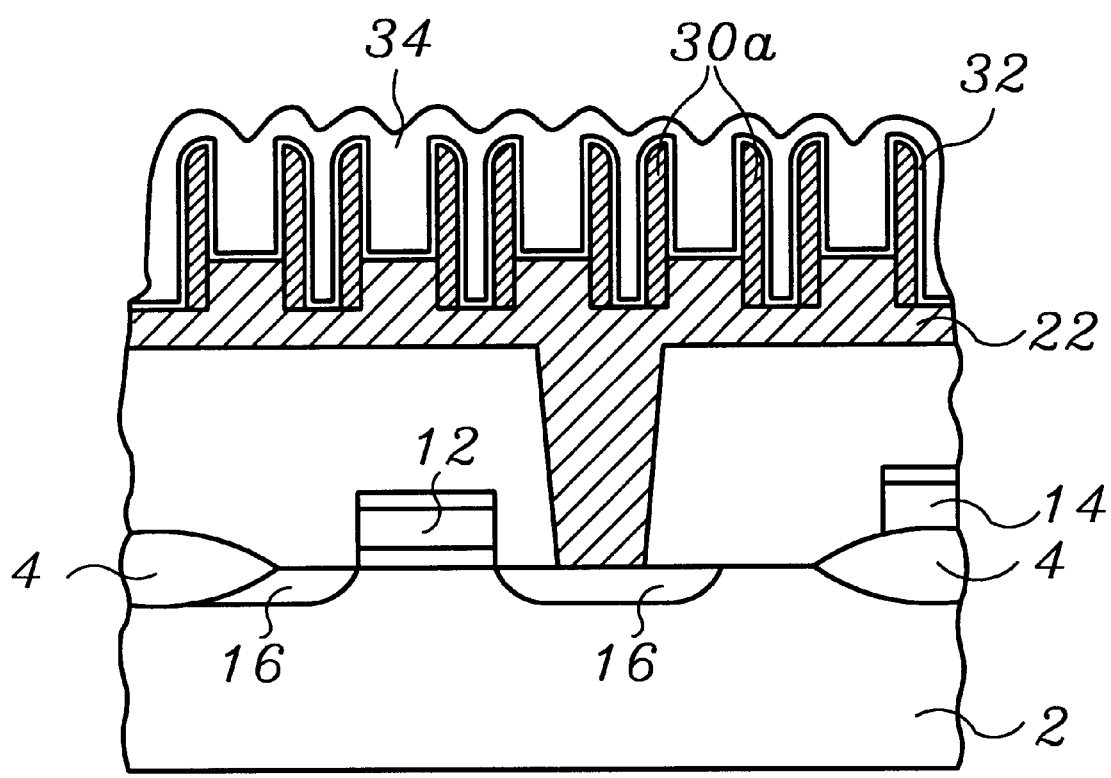
FIG. 12 is a cross section view of a semiconductor wafer illustrating the step of forming a third conductive layer on the dielectric film.

Turning next to FIG. 11, a dielectric film 32 id deposited along the surface of the first conductive layers 22 and the conductive side wall spacers 30a. The dielectric film 32 is preferably formed of either a double film of nitride/oxide film, a triple film of oxide/nitride/oxide, or any other high dielectric film such as tantalum oxide($Ta_2O_5$). Finally, as is shown in FIG. 12, a third conductive layer 34 is deposited using a conventional LPCVD process over the dielectric film 32. The third conductive layer 34 provides a top storage electrode and is formed of doped polysilicon, in-situ doped polysilicon, aluminum, copper, tungsten or titanium. Thus, a semiconductor capacitor is formed which comprises a conductive layer 34 as its top storage electrode, a dielectric 32, and a conductive layer 22 and conductive side wall spacers 30a as the bottom storage electrode.

The present invention thus provides capacitors with an enlarged surface area. The present invention uses the high etching selectivity between BPSG and polysilicon to fabricate the capacitor. Moreover, the multi-crown shaped structure increases the surface area of the capacitor. Therefore the present invention increases the performance of the capacitor.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing an integrated circuit capacitor, the method comprising the steps of:

forming a first TEOS-oxide layer on said a semiconductor substrate;

etching said first TEOS-oxide layer to form a contact hole;

forming a first polysilicon layer on said TEOS-oxide layer and filling said contact hole with said first polysilicon layer;

forming a second TEOS-oxide layer on said first polysilicon layer;

forming a HSG-Si layer on said second TEOS-oxide layer;

etching said HSG-Si layer to define separated HSG-Si;

using said separated HSG-Si as a mask to etch said second TEOS-oxide layer to form dielectric pillars;

using said dielectric pillars as a mask for etching a portion of said first polysilicon layer and as an etch stop layer for removing said separated HSG-Si;

forming a second polysilicon layer on a surface of said second TEOS-oxide layer and said first polysilicon layer;

etching said second polysilicon layer to define polysilicon side wall spacers;

removing said second TEOS-oxide layer to define multi-crown shaped structure from said side wall spacers;

forming a dielectric film on the surface of said first conductive layer and said second conductive layer; and forming a third polysilicon layer over said dielectric film.

2. The method of claim 1, wherein said first polysilicon is formed having a thickness of a range about 500–6000 angstroms.

3. The method of claim 1, wherein said second TEOS-oxide is formed having a thickness of a range about 1000–10000 angstroms.

4. The method of claim 1, wherein said second polysilicon layer has a thickness in a range of about 100–1000 angstroms.

5. The method of claim 1, wherein the etchant of said etch to form said dielectric pillars is selected from the group consisting of $CF_4/CHF_3/Ar$, $CHF_3/O_2$ and $CF_4/H_2$.

6. The method of claim 1, wherein the etchant of said etch to remove said HSG-Si is selected from the group consisting of $C_2F_6$, $SF_6$, $CF_4+O_2$, $CF_4+Cl_2$ or $CF_4+HBr$.

7. The method of claim 1, wherein said HSG-Si is formed with a thickness in a range of about 500–1000 angstroms.

8. The method of claim 1, wherein said second TEOS-oxide layer is removing by a high selective etching process.

9. The method of claim 8, wherein said high selective etching process utilizes a low pressure HF vapor to selectively etch said second dielectric layer and said side wall spacers.

10. The method of claim 9, wherein the relative susceptibility to etching of the second dielectric layer to said side wall spacers is about 100 to 1.

11. The method of claim 1, wherein said dielectric film is formed of tantalum oxide($Ta_2O_5$).

12. The method of claim 1, wherein said dielectric film is formed of a triple film of oxide/nitride/oxide.

13. The method of claim 1, wherein said dielectric film is formed of a double firm of nitride/oxide film.

14. A method of forming a multi-crown polysilicon structure comprising the steps of:

forming a first polysilicon layer;

forming a TEOS-oxide layer on said first polysilicon layer;

forming a HSG-Si layer on said first TEOS-oxide layer;

etching said silicon layer to form separated HSG-Si;

using said separated HSG-Si as a mask to etch said TEOS-oxide layer to form dielectric pillars;

using said dielectric pillars as a mask for etching a portion of said first polysilicon layer and as an etch stop layer for removing said separated HSG-Si;

forming a second polysilicon layer along the surface of said TEOS-oxide layer and said first polysilicon layer;

etching said second polysilicon layer to form polysilicon side wall spacers; and removing said TEOS-oxide layer to form multi-crown shaped structure.

* * * * *